(12) United States Patent
Lotz et al.

(10) Patent No.: US 9,920,421 B2
(45) Date of Patent: Mar. 20, 2018

(54) TRANSPARENT BODY FOR A TOUCH PANEL MANUFACTURING METHOD AND SYSTEM FOR MANUFACTURING A TRANSPARENT BODY FOR A TOUCH SCREEN PANEL

(71) Applicant: APPLIED MATERIALS, INC., Santa Clara, CA (US)

(72) Inventors: Hans-Georg Lotz, Gruendau-Rothenbergen (DE); Neil Morrison, Darmstadt (DE); Thomas Deppisch, Aschaffenburg (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 725 days.

(21) Appl. No.: 14/101,032

(22) Filed: Dec. 9, 2013

(65) Prior Publication Data

US 2015/0109234 A1 Apr. 23, 2015

(30) Foreign Application Priority Data

Oct. 18, 2013 (EP) .................................... 13189385

(51) Int. Cl.
*C23C 14/08* (2006.01)
*C23C 14/14* (2006.01)
(Continued)

(52) U.S. Cl.
CPC .......... *C23C 14/562* (2013.01); *C23C 14/086* (2013.01); *C23C 14/14* (2013.01);
(Continued)

(58) Field of Classification Search
CPC ........ H05K 3/00; H05K 1/028; H05K 1/0393; G06F 3/044; G06F 3/041; C23C 14/35;
(Continued)

(56) References Cited

U.S. PATENT DOCUMENTS 4,838,656 A * 6/1989 Stoddard ............. G02F 1/13439
216/101
2005/0100830 A1 5/2005 Xu et al.
(Continued)

FOREIGN PATENT DOCUMENTS

EP 937691 A1 * 8/1990
EP 1 484 644 A2 12/2004
(Continued)

OTHER PUBLICATIONS

European Patent Office; Extended European Search Report for Application No. 13189385.1; 9 pages; dated Mar. 10, 2014.

*Primary Examiner* — Michael A Band
(74) *Attorney, Agent, or Firm* — Patterson + Sheridan LLP

(57) ABSTRACT

A process for manufacturing a transparent body for a touch screen panel is described. The process includes: depositing a first transparent layer stack over a flexible transparent substrate, wherein said first transparent layer stack includes at least a first dielectric film with a first refractive index, and a second dielectric film with a second refractive index different from the first refractive index; providing a transparent conductive film over the first transparent layer stack; depositing a layer of a conductive material over the transparent conductive film; providing a polymer layer over the layer of a conductive material; imprinting a pattern, e.g. a 3D pattern, on the polymer layer; etching the layer of the conductive material based upon the pattern to form conductive paths for the touch screen panel; and etching the transparent conductive film based upon the pattern to form a structured transparent conductive pattern for touch detection.

17 Claims, 7 Drawing Sheets

(51) Int. Cl.
| | |
|---|---|
| *C23C 14/34* | (2006.01) |
| *C23C 14/56* | (2006.01) |
| *C23C 14/58* | (2006.01) |
| *H01J 37/34* | (2006.01) |
| *G06F 3/044* | (2006.01) |
| *G06F 3/041* | (2006.01) |
| *G03F 9/00* | (2006.01) |
| *C23C 14/35* | (2006.01) |
| *H05K 1/02* | (2006.01) |
| *H05K 3/00* | (2006.01) |
| *H05K 1/03* | (2006.01) |

(52) U.S. Cl.
CPC .......... *C23C 14/3464* (2013.01); *C23C 14/35* (2013.01); *C23C 14/5873* (2013.01); *G03F 9/7042* (2013.01); *G06F 3/041* (2013.01); *H05K 1/028* (2013.01); *H05K 1/0393* (2013.01); *H05K 3/00* (2013.01); *G06F 3/044* (2013.01); *G06F 2203/04103* (2013.01); *H01J 37/3405* (2013.01); *H05K 2201/0108* (2013.01); *H05K 2201/0145* (2013.01); *H05K 2201/0326* (2013.01); *H05K 2201/10128* (2013.01)

(58) Field of Classification Search
CPC ... C23C 14/086; C23C 14/14; C23C 14/3464; C23C 14/562; C23C 14/352; C23C 14/568; C23C 14/5873; G03F 7/0002; G03F 9/7042
See application file for complete search history.

(56) References Cited

U.S. PATENT DOCUMENTS

| | | |
|---|---|---|
| 2006/0144814 A1 | 7/2006 | Kolesnychenko et al. |
| 2011/0318553 A1* | 12/2011 | Lotz ....................... C23C 14/34 |
| | | 428/212 |

FOREIGN PATENT DOCUMENTS

| | | | |
|---|---|---|---|
| EP | 1 729 169 A1 | 12/2006 | |
| WO | 2004/006019 A1 | 1/2004 | |
| WO | WO-2004006019 A1 * | 1/2004 | ........... B29C 43/003 |
| WO | 2013/034181 A1 | 3/2013 | |
| WO | 2013/143614 A1 | 10/2013 | |
| WO | 2013/143615 A1 | 10/2013 | |

* cited by examiner

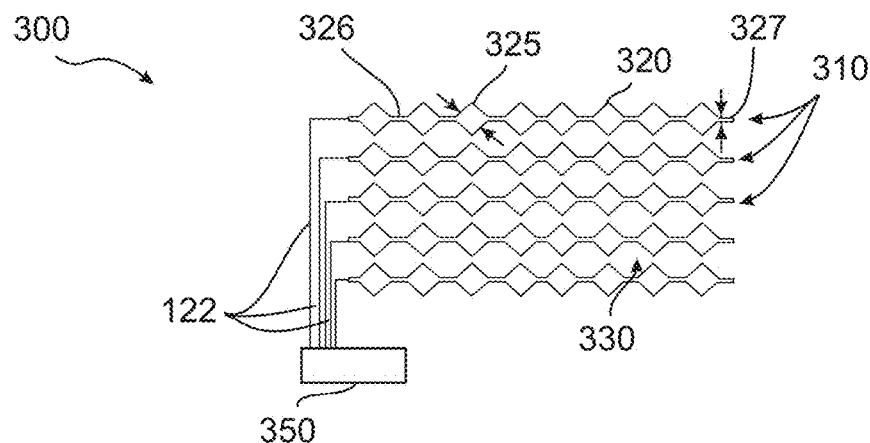
Fig. 3
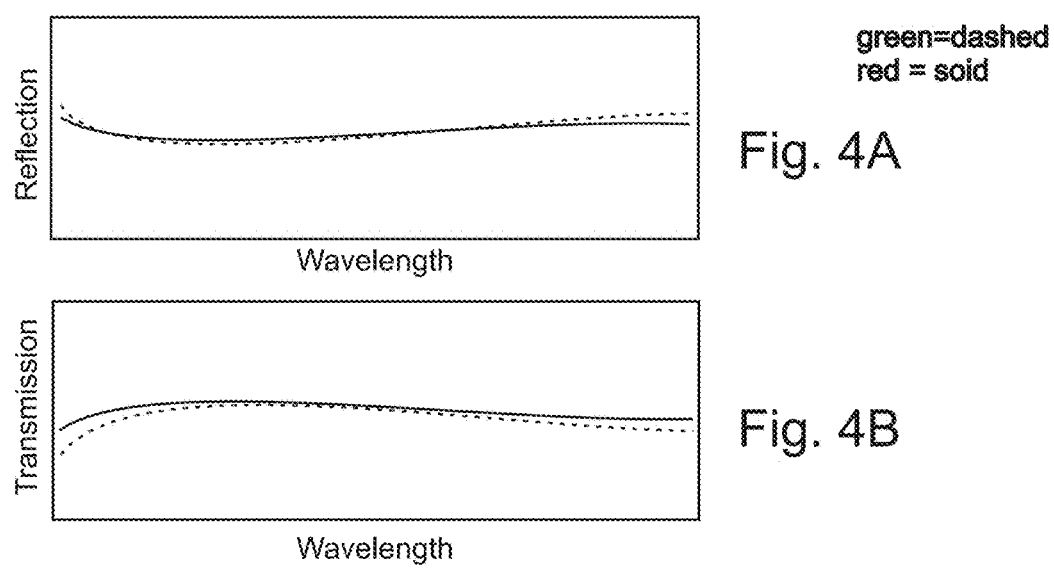
Fig. 4A
Fig. 4B

TRANSPARENT BODY FOR A TOUCH PANEL MANUFACTURING METHOD AND SYSTEM FOR MANUFACTURING A TRANSPARENT BODY FOR A TOUCH SCREEN PANEL

TECHNICAL FIELD

Embodiments of the present disclosure relate to processes and systems for manufacturing a transparent body for a touch panel and a transparent body fabricated according to these processes.

BACKGROUND ART

Touch panels are a particular class of electronic visual displays, which are able to detect and locate a touch within a display area. Generally, touch panels include a transparent body disposed over a screen and configured to sense a touch. Such a body is substantially transparent, so that light in the visible spectrum emitted by the screen can be transmitted therethrough. At least some known touch panels include a transparent body constituted by a barrier and a transparent conductor formed, in this order, over a substrate. A touch on the display area of such a panel generally results in a measurable change of capacitance in a region of the transparent body. The change in capacitance may be measured using different technologies, so that the position of the touch can be determined.

A transparent body for use with a touch panel is subject to some particular requirements. In particular, one key requirement is that the transparent body is stable enough for withstanding multiple contacts on the screen and harsh conditions, so that reliability of the touch screen is not compromised over time. However, at least some known transparent bodies included in touch screens, which are considered robust, interfere with a proper transmission of light therethrough due to, for example, thickness, composition, and structure of the layers forming the transparent body. Furthermore, fabricating such a stable transparent body of high quality, for example with a uniform and defect-free barrier, is challenging.

Further, it is to be considered that there are different types of transparent bodies for touch panels. Particular consideration of the optical characteristics, e.g. the appearance to a user, has to be taken into account for transparent bodies, wherein the conductive layer for measuring the change in capacitance is a structured conductive layer.

A further aspect to be considered is the steadily increasing size of displays, wherein beyond the optical characteristics described above, also the electrical characteristics are of increasing interest. Thereby, a design of thin film based flat panel displays and touch screen technologies which provides an invisible object, which is patterned with respect to conductivity (like a touch sensor structure) and which exhibits enhanced optical and electrical performance compared to conventional structures, is desired.

Generally, it is desirable to provide touch panels from an unbreakable material. Thus, plastic foils would be a suitable substrate. However, processing of foils is even more challenging, e.g. due to their limited capability to be heated. Accordingly, larger sized projective capacitive touch panel sensors based on rugged, unbreakable, PET foil substrates, require specific electrical properties, high optical and color neutral transmission in combination with the invisibility of the sensor elements after patterning.

Accordingly, it is desirable to have a process and an apparatus for forming a high-quality transparent body for use in a touch panel in a manner such that the body is stably formed over the substrate without compromising a proper transmission of light in the visible spectrum and improved electrical characteristics.

SUMMARY OF THE INVENTION

According to one embodiment, a process for manufacturing a transparent body for a touch screen panel is provided. The process includes depositing a first transparent layer stack over a flexible transparent substrate, wherein said first transparent layer stack includes at least a first dielectric film with a first refractive index, and a second dielectric film with a second refractive index different from the first refractive index; providing a transparent conductive film over the first transparent layer stack; depositing a layer of a conductive material over the transparent conductive film; providing a polymer layer over the layer of a conductive material; imprinting a pattern, e.g. a 3D pattern, on the polymer layer; etching the layer of the conductive material based upon the pattern to form conductive paths for the touch screen panel; and etching the transparent conductive film based upon the pattern to form a structured transparent conductive pattern for touch detection.

According to another embodiment, a transparent body for a touch screen panel is provided. The transparent body includes a flexible transparent substrate; a first transparent layer stack deposited over the transparent substrate, wherein said transparent layer stack includes at least a first dielectric film with a first refractive index, and a second dielectric film with a second refractive index different from the first refractive index; a structured transparent conductive pattern for touch detection, wherein the structured transparent conductive pattern for touch detection is etched based upon an imprinted pattern; and conductive paths for the touch screen panel, wherein the conductive paths are etched based upon the imprinted pattern.

According to another embodiment, a system for manufacturing a transparent body for a touch screen panel. The system includes a first deposition assembly configured to deposit a first transparent layer stack over a substrate, said first transparent layer stack including at least a first dielectric film with a first refractive index, and a second dielectric film with a second refractive index different from the first refractive index; a second deposition assembly configured to deposit a transparent conductive film; a third deposition assembly configured to deposit a layer of conductive material; a photoresist deposition station; an imprint station; a curing station; and etching station; and a third deposition assembly configured to deposit a second transparent layer stack, said second transparent layer stack including at least third dielectric film with a third refractive index; wherein said first deposition assembly, said second deposition assembly, and the third deposition assembly are arranged such that the first transparent layer stack, the transparent conductive film and the second transparent layer stack are disposed over the substrate in this order, and wherein at least one of the first deposition assembly or the second deposition assembly or the third deposition assembly comprises a sputtering system operatively coupled to a target, said sputtering system being configured to deposit at least one of the first dielectric film, the second dielectric film, the third dielectric film, the fourth dielectric film or the transparent conductive film by sputtering of the target, typically by magnetron sputtering from a rotatable target.

BRIEF DESCRIPTION OF THE DRAWINGS

A full and enabling disclosure, including the best mode thereof, to one of ordinary skill in the art, is set forth more particularly in the remainder of the specification, including reference to the accompanying figures, wherein:

FIG. 3 shows a schematic drawing of a patterned TCO layer provided in a layer stack according to embodiments described herein;

FIGS. 4A and 4B show graphs of the reflection and the transmission of layer stacks illustrating the optical properties of the patterns with and without TCO;

DETAILED DESCRIPTION OF THE INVENTION

Reference will now be made in detail to the various embodiments, one or more examples of which are illustrated in the figures. Each example is provided by way of explanation, and is not meant as a limitation of the invention. It is contemplated that elements of one embodiment may be advantageously utilized in other embodiments without further recitation.

Figure 1:
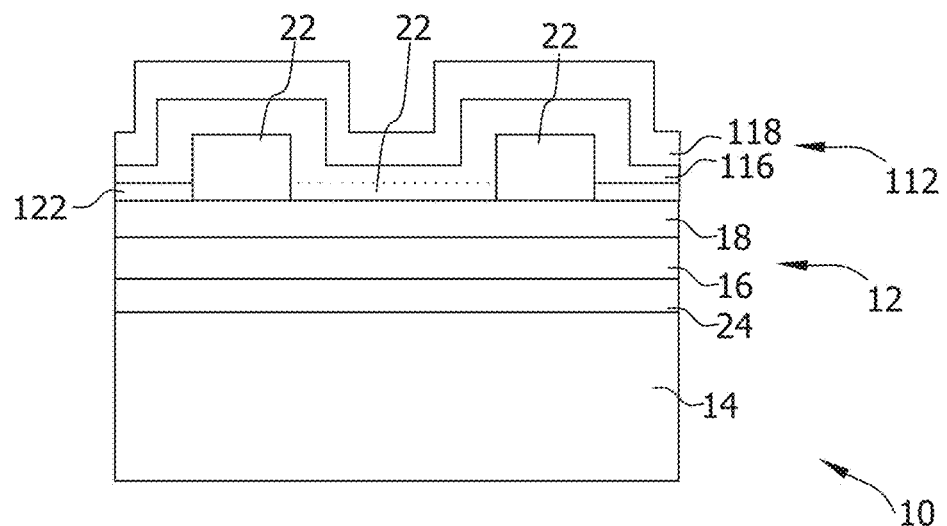
FIG. 1 is a schematic representation of an exemplary transparent body for use in a touch panel in accordance with embodiments herein.

According to embodiments herein, a first transparent layer stack 12, as depicted in FIG. 1, is deposited over a substrate 14. The term "substrate" as used herein shall embrace flexible substrates such as a web or a foil. The term "transparent" as used herein shall particularly include the capability of a structure to transmit light with relatively low scattering, so that, for example, light transmitted therethrough can be seen in a substantially clear manner. In the case of a flexible substrate, it is typical that substrate 14 has a hard coat 24 formed thereon.

According to typical embodiments, a layer stack is constituted by a number of films formed (e.g., by deposition) one atop of another. In particular, embodiments herein include depositing a first transparent layer stack which may be constituted by a plurality of dielectric films, that is, films that, substantially, do not conduct electricity. In particular, first transparent layer stack 12 may include a first dielectric film 16, and a second dielectric film 18, as exemplarily depicted in FIG. 1. Thereby, the first transparent layer stack may constitute a barrier for use in a touch panel.

As shown in FIG. 1, a structured transparent conductive oxide (TCO) film 22 is provided over the transparent layer stack. The dotted areas 22 indicate the connections of the TCO areas, which will be explained in more detail with respect to FIG. 3. According to typical embodiments, the structured TCO layer can be provided by depositing a TCO layer and patterning the TCO layer in order to provide a structured TCO layer. According to embodiments described herein, the patterning is conducted with a self-aligned imprint lithography process, which can be used beneficially to provide touch panel transparent bodies having flexible substrates, e.g. PET films.

According to typical embodiments, which can be combined with other embodiments described herein, the transparent conductive oxide layer can be an indium tin oxide (ITO) layer, a doped ITO layer, impurity-doped ZnO, $In_2O_3$, $SnO_2$ and CdO, ITO (In2O3:Sn), AZO (ZnO:Al), IZO (ZnO:In), GZO (ZnO:Ga), indium gallium zinc oxide (IGZO), multi-component oxides including or consisting of combinations of ZnO, $In_2O_3$ and $SnO_2$, a layer stack from at least an ITO layer and a metal layer, e.g. an ITO/metal/ITO-stack or a metal/ITO/metal-stack.

In light of the increasing size of touch panels or touch displays, it is desired that the sheet resistance of the TCO layer gets smaller and smaller. However, the desire for smaller sheet resistances contradicts the desire to have thin TCO layers, which appear to be invisible for a user. According to typical embodiments, which can be combined with other embodiments described herein, the sheet resistance of the TCO layer, e.g. an ITO layer should be 150 Ohm/sq or less, typically 100 Ohm/sq or less, even more typically 50 Ohm/sq or less.

For good device performance, a thin TCO layer, e.g. a thin ITO layer, is required. For example, the layer thickness can be 25 nm or below. In some current process technologies and design integration schemes, the sheet resistance is limited at around 100 Ohm/sq. A lower sheet resistance is not possible with the current layer architecture where ITO is deposited on the top of the layer stack. Accordingly, a further improvement is desired, wherein electrical properties (e.g. low sheet resistance) and optical properties (e.g. invisibility) are both to be considered.

According to some embodiments, a TCO layer, e.g. an ITO layer, can be deposited as the last layer on top of the layer stack 12, which forms an index-matching stack. In an alternative layer structure the TCO layer, e.g. an ITO layer, can be embedded within the layer system. This so-called "buried ITO" allows for thicker ITO layers with lower sheet resistance, high optical and color neutral transmission with a patterned ITO layer.

In sheet-to-sheet (S2S) processing of rigid substrates a technology with standard photolithographic process is used for structuring of electronic devices. The same technology is often also applied to create patterned ITO layers within a layer stack having ITO layers on rigid substrates. However, for Roll-to-Roll (R2R) processing of buried ITO on flexible substrates, such a process is too expensive.

In light thereof, embodiments described herein, include a TCO layer 22 (see, e.g. FIG. 1A) and a copper layer 122. The copper layer is used to form conductive paths to the TCO pattern with reduced line width resulting in a smaller bezel around a touch panel. After the coating steps a multi-level imprint method is used for patterning the TCO layer and copper layer.

As shown in FIG. 1A, a second transparent layer stack 112 can be provided over the TCO layer 22. According to typical embodiments, a second layer stack is constituted by a number of films formed (e.g., by deposition) one atop of another. In particular, embodiments herein include depositing a second transparent layer stack, which may be constituted by a plurality of dielectric films, that is, films that, substantially, do not conduct electricity. In particular, second transparent layer stack 112 may include a third dielectric film 116, and a fourth dielectric film 118, as exemplarily depicted in FIG. 1A. Thereby, an improved index matching can be provided. Further, a passivation of the below TCO layer can be provided. Yet further, an overall transmittance can be provided as compared to an uncoated substrate.

According to typical embodiments described herein, which can be combined with other embodiments described herein, the first dielectric film 16 of the first transparent layer stack 12, i.e. the first transparent dielectric film over the substrate is a high refractive index film, e.g. with a refractive index of 1.8 or above. According to yet further alternative or additional modifications, the transparent conductive oxide layer is provided between, e.g. directly between, a low refractive index (1.5 or below) dielectric film and a high refractive index (1.8 or above) dielectric film. Further, additionally or alternatively, the last dielectric film over the substrate can be a low refractive index dielectric film. Thereby, the last dielectric film is referred to as the last dielectric film of the touch panel transparent body, i.e. before a transparent adhesive or air gap is provided at a bonding interface to a color filter, a second flexible substrate or an optoelectronic device.

As compared to previous designs of touch panel displays where, particularly for layer stacks or transparent bodies with thicker TCO layers on flexible substrates, embodiments described herein can provide a layer stack or transparent body having at least a first index matching layer stack, e.g. one or more dielectric films, a TCO layer over the index matching layer stack, wherein the TCO layer can have a sheet resistance of 100 Ohm/sq or below, a conductive layer for forming conductive paths for contacting the TCO layer, and optionally a second index matching layer stack. This can be provided with one lithographic process, e.g. a self-aligned imprint lithography (SAIL) process.

A transparent adhesive, e.g. an optical clear adhesive, can be provided onto the transparent body, i.e. in contact with the transparent body according to embodiments described herein. Additionally or alternatively, a second flexible substrate can cover the transparent body of the touch panel. Embodiments thereby provide an "invisible" touch panel structure, which also provides for a low resistance.

The optional second transparent layer stack for sandwiching the TCO between two transparent layer stacks and for obtaining a solution to low-resistance "invisible" TCO patterns refers to a structure having a TCO layer on top before this structure is bonded, e.g. optically bonded, onto the adjacent components of a touch screen display with a transparent adhesive. By utilizing the second transparent layer stack, a further improved pattern "invisibility" of the TCO pattern can be achieved.

According to embodiments herein, a first transparent layer stack 12, as depicted in FIG. 1A, is deposited over a substrate 14, wherein in the case of a flexible substrate, it is typical that substrate 14 has a hard coat 24 formed thereon.

Conventional layer stacks or transparent bodies for touch panels can result in a functional screen (like a touch screen). However, an inferior sunlight readability, a colored appearance (reflectance) of the screen and a color change with respect to the produced picture from the underlying display, and a more or less visible pattern from the structured core layer of the functional screen (e.g. a patterned transparent conductive oxide, TCO) is often obtained. Further, the conductivity might not be sufficient for large area touch panels, e.g. touch panels with a size of diagonal 7 inch or above, specifically for touch screens with a diagonal of more than 20 inch. Yet, further contacts for contacting the patterned TCO of the touch panel, which are provided at the bezel of the screen, typically require a large area such that the substrates have a wide rim.

Due to the structure of the transparent layer stack, it is facilitated that the conductive film does not prejudice an optimal transmission of light through the body. In particular, a transparent layer stack according to embodiments herein facilitates that a conductive film, even a structured conductive film, does not affect the neutrality of the reflectance color, as further discussed below. The combined process of manufacturing the conductive paths from a layer of conductive material, e.g. copper or silver, together with the TCO pattern, allows for a reduced bezel size and makes touch panel structures on flexible substrates economically more competitive.

According to typical embodiments, which can be combined with other embodiments described herein, the sheet resistance of the structured TCO layer is 100 Ohm/sq and below, e.g. 10 to 50 Ohm/sq. Typically, the sheet resistance is the physical quantity referred to in this context even though this value refers to the resistance of a layer with a sufficiently large area, i.e. without the patterns being too small. The structured TCO pattern, e.g. lines, corresponds to a line resistance in Ohm. However, the sheet resistance is the relevant parameter and can be determined by deposition of test areas or can be determined or calculated based upon the resistance of patterned structures and the structure geometry. Accordingly, even though the sheet resistance of the structured layer cannot be directly determined (yet indirectly) and rather refers to the resistance of an unstructured layer, a person skilled in the art would relate to a sheet resistance corresponding to a value for the structured layer.

Thereby, for example, TCO layer thicknesses of 20 nm and above, e.g. 50 nm to 150 nm, can be utilized. Additionally or alternatively, transparent conductive oxides with a specific resistance lower than the typical resistivity range of ITO produced with various process schemes, which is 130-450 μΩcm for bulk ITO i.e. superior electrical characteristics, but with inferior optical characteristics, could be used. The reduced sheet resistance and/or the increased TCO layer thickness results in the desire for further improvement of the layer stack, as the, e.g. thicker, structured TCO layer tends to be more easily visible.

According to embodiments described herein, an enhanced structure and method for manufacturing such an invisible object, e.g. a touch sensor, are provided to surpass limitations to the patterned TCO thickness and its conductivity on flexible substrates. Layer stacks or transparent bodies, as described herein, which are provided on a display or the like, are considered invisible when placed in an atmosphere of air (refractive index 1) with very little difference in the optical appearance between areas with and without the TCO layer, such as ITO ("invisible" ITO).

According to some embodiments, which can be combined with other embodiments described herein, different stacks and mounting schemes for an invisible object can be provided, e.g. for being integrated into or mounted onto a display in such a way, that at least on one side of the object the adjacent medium has a refractive index being different than 1, e.g. 1.3 to 1.7. By these means, the invisible stack can support a sheet resistance of 20 Ohm/sq or below, which is an improvement by a factor of 10 compared to the previous concepts without compromising on optical performance.

Figure 2:
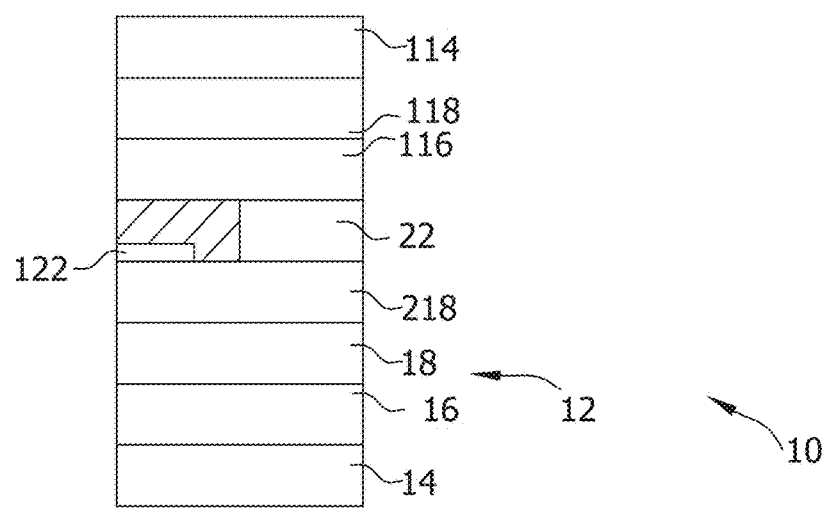
FIG. 2 is a schematic representation of a further exemplary transparent body for use in a touch panel and an opto-electronic device to which the body is bonded in accordance with embodiments herein.

An exemplary transparent body 10 is shown in FIG. 2. A flexible substrate is provided. The flexible transparent substrate can, for example, be a hard-coated plastic film or a hard-coated foil. For example, a hard-coated PET foil can be used. According to other embodiments a material selected from the group consisting of: PET, COC, TAC, COP, and PEN can be utilized as a flexible transparent substrate. Typically, any of these substrates may be hard-coated.

Before a first transparent dielectric film 16 is deposited, optionally a seed layer can be provided on the substrate. The seed-layer can, for example, be a thin layer of 5 nm or below and/or can include SiOx. A first dielectric film 16, a second dielectric film 18, and a third dielectric film 218 are deposited as exemplarily shown in FIG. 2. Typically, the first dielectric film is made of a high refractive index material, e.g. Nb2O5. Typically, the second dielectric film 18 is made of a low refractive index material, e.g. SiOx. Typically, the third dielectric film 218 is made of a high refractive index material, e.g. Nb2O5.

According to typical embodiments, thereafter a patterned layer system is provided. This is indicated by the TCO layer 22, the layer of a conductive material 122, such as copper, silver or aluminum, AlNd, Mo, and MoNb and the hatched area, which indicates areas, where no conductive layer 122 and no TCO layer 22 is provided. The refractive indices of these areas may result in a visibility of the patterned structure. Therefore, the first dielectric layer stack and optionally the second dielectric layer stack can be provided in order to provide for an index matching and invisibility of the different pattern layers.

According to the embodiments described herein, and as described in more detail below, the patterned TCO layer 22 and the pattered layer of a conductive material 122 are patterned by an imprint process, such that both layers can be patterned with one lithography step.

A transparent body including the substrate 14, the transparent layer stack, the patterned TCO layer 22 and the patterned layer of a conductive material 122, and thereafter a flexible foil 114, i.e. a structure similar to the one shown in FIG. 2 without layer 116 and 118, can be described as a structure having a TCO at the top of the transparent body. Typically, these structures may have maximum possible thickness of the TCO layer, e.g. an ITO layer, around 25 nm. This may result in a transparence of Ty 89% and a sheet resistance of around 100 Ohm/Square.

As shown in FIG. 2, further dielectric films 116 and 118 can be provided. Typically, the fourth dielectric film 116 is made of a low refractive index material, e.g. SiOx. Typically, the fifth dielectric film 118 is made of a high refractive index material, e.g. Nb2O5. Thereby, a buried TCO layer is provided, which allows for even thicker TCO layers while maintaining a sufficient invisibility. Accordingly, a sheet resistance 50 Om/square and below can be realized. For such embodiments, typically a second imprint-etch step is provided to uncover the lines or paths of the conductive material.

The layer system shown in FIG. 2 is encapsulated within two hard coated flexible substrates, i.e. the flexible transparent substrate 14 and the flexible transparent foil 114. These embodiments allow a high optical transmittance of Ty=90% combined with a low surface resistance of 50 Ohm/square.

FIG. 3 shows a further example of a layer including a TCO pattern. The TCO layer 300 has TCO areas 320 and gaps 330 between the TCO areas 320. As can be seen in FIG. 3, the pattern of the TCO may connect the TCO areas 320 in one direction and may provide substantially no connection between the TCO areas 320 in another direction. For instance, rows 310 of TCO areas 320 are formed by connecting the TCO areas 320, whereas substantially no connection is provided between the rows 310. In the example shown in FIG. 3, the TCO pattern includes rhomb-like TCO areas; however, the herein described TCO pattern is not limited to the shown pattern and may provide differently shaped TCO areas, such as TCO areas having the shape of stripes, a rectangular shape, a quadratic shape, a triangular shape, a polygon shape, or any shape suitable for being used for a TCO layer in a touch panel.

According to some embodiments, the TCO areas may have a diameter of typically between about 1 mm and about 7 mm, more typically between about 2 mm and about 6 mm, and even more typically between about 3 mm and about 5 mm. In one embodiment, the diameter of a TCO area (indicated by the reference sign 325 in FIG. 3) may be 3 mm. It should be understood that the term "diameter" depends on the form of the TCO areas, and may also be defined by one dimension of the TCO area in one direction. According to some embodiments, and as already explained above, the TCO areas may be connected by paths (such as paths 326). In one embodiment, the path 326 connecting TCO areas 320 in one direction so as to form rows 310 may have a width 327 of about 1 mm.

FIG. 3 further shows copper lines 122 being in touch with the TCO pattern. According to some embodiments, the copper lines 122 connect the TCO pattern with a controller 350. For instance, the controller 350 may detect a difference in the current being passed by the TCO pattern and the copper lines, and being induced by touching the touch screen.

FIG. 4A shows the reflection in a spectral range from 400 nm to 800 nm. The dashed line shows the reflection spectrum at a position where a TCO material, e.g. ITO, is provided, i.e. has not been etched. The solid line shows the reflection spectrum at a position where no TCO material, e.g. ITO, is provided. As can be seen, the two spectra have a rather good similarity, e.g. ΔE<2, such that the visible appearance of areas with and without TCO material is similar. Accordingly, the touch panel is then "invisible".

FIG. 4B shows the transmission in a spectral range from 400 nm to 800 nm. The dashed line shows the transmission spectrum at a position where a TCO material, e.g. ITO is provided, i.e. has not been etched. The solid line shows the transmission spectrum at position where no TCO material, e.g. ITO, is provided. As can be seen the two spectra have a rather good similarity such, e.g. ΔE<2, that the visible appearance of areas with and without TCO material is similar. Accordingly, the touch panel is then "invisible".

According to some embodiments, which can be combined with other embodiments described herein, a self-aligning imprint lithography (SAIL) process is used to pattern the TCO layer and/or a conductive material, such as copper, which is used to provide the connection lines for contacting the TCO pattern. The SAIL process can be applied for one level or layer, two levels or layers or even more levels or layers, e.g. up to four levels or layers. Thereby, the manufacturing of a transparent body for a touch panel can benefit due to reduced manufacturing costs due to reduced effort of lithography steps. This can be particularly useful for processing, e.g. patterning of layers on flexible substrates, such as films or foils.

Figure 5A:
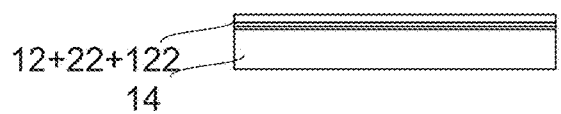
FIGS. 5A to 5F are schematic representations of the manufacturing of an exemplary transparent body for use in a touch panel in accordance with embodiments herein.
Figure 5B:
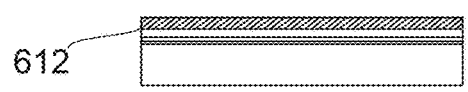
Figure 5C:
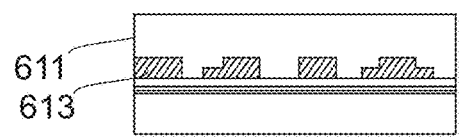
Figure 5D:
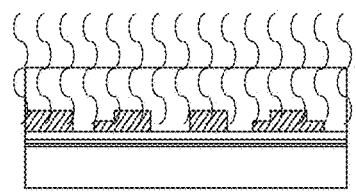
Figure 5E:
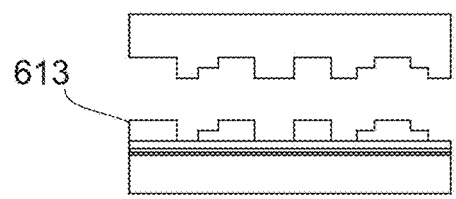
Figure 5F:
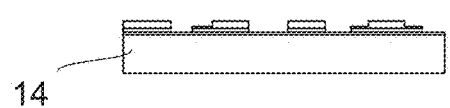

FIGS. 5A to 5F show the steps of a SAIL process, which can be applied according to embodiments described herein, e.g. as one level or two level processes. In FIG. 5A a coated substrate 14 is provided. Thereby, the coating of the substrate includes the transparent layer stack, i.e. the index matching layer stack 12, the TCO film 22 and the layer of conductive material 122. In FIG. 5B, a further coating with a polymer layer 612 is provided. The polymer layer forms a photoresist, which can be cured, e.g. with UV light as shown in FIG. 5D. Before curing, the photoresist is structured in an imprint step in FIG. 5C, where a pattern, typically a 3D pattern, is embossed. Thereby, a 3D pattern is understood as having a plane in which recesses are embossed. That is the 3D pattern includes according to some embodiments, which can be combined with other embodiments, a topography, which can have one or more levels of depths of the imprint. According to some embodiments, these recesses can be embossed with one depth or with two or more depths. For the imprint a stamp 611 is embossed in the polymer layer to form the polymer pattern 613. In step 5E, i.e. after the curing of the photoresist in step 5D, the stamp is released and the coated substrate can be etched. Thereby, several layers can be etched. This can e.g. depend on the fact whether a one level or a multi-level imprint is conducted.

According to embodiments described herein, typically the layer of conductive material is first etched to form lines or paths, such as copper lines, for contacting the TCO pattern with an external controller. Thereafter, the TCO layer is etched. For example, a structure as shown in FIG. 3 can be etched in the TCO layer to form a patterned transparent conductive oxide film for a touch application in a touch panel.

Figure 6:
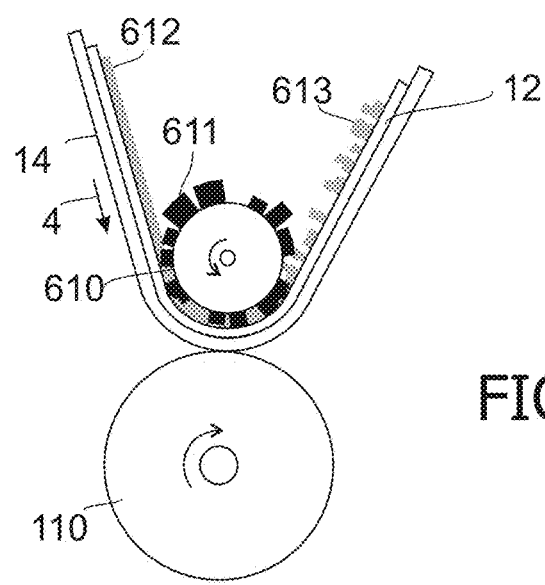
FIG. 6 is a schematic drawing of an apparatus for providing a pattern in a polymer layer as used in embodiments described herein.

Further details of the SAIL process, which can additionally or alternatively be provided are shown exemplarily in FIG. 6. The imprint station includes a roller 610, which can rotate around its axis. Upon rotation of the roller 610, the pattern is imprinted in a polymer layer 612. As shown in FIG. 6, the roller 610 has a stamp 611 provided thereon. When the substrate is moved through the gap between the roller 610 and, for example, another roller 110, the pattern of the stamp 611 is embossed in the polymer layer 612. This results in the patterned polymer layer 613. Arrow 4 in FIG. 6 indicates the movement of the substrate 14 through the gap between the roller 110 and the roller 610. Thereby, the rollers rotate as indicated by the arrows.

According to some embodiments, which can be combined with other embodiments described herein, a layer structure, i.e. a transparent body can include the following layers. A transparent flexible substrate, typically a hard-coated plastic film, such as a hard-coated PET film is provided. Optionally, one or more optional layers of the group consisting of: a seed layer, a SiOx seed layer, a barrier layer, and an adhesion layer, can be provided on the substrate. Thereafter, an index matching layer stack, i.e. a dielectric layer stack is deposited. The layer stack can include two or more dielectric layers with different refractive indices. For example, as a first layer of the layer stack a high refractive index layer, e.g. Nb2O5, is deposited on the substrate or the optional layer(s). Thereafter, as a second layer of the layer stack a low refractive index layer, e.g. SiOx, is deposited on the first layer of the layer stack. Thereafter, as a third layer of the layer stack a high refractive index layer, e.g. Nb2O5, is deposited on the second layer of the layer stack. According to yet further embodiments, which can be combined with other embodiments described herein, further dielectric layers can be provided in the dielectric layer stack. Thereafter an ITO layer is deposited and a copper layer is deposited on the ITO layer.

A two-level imprint step is provided in a photoresist, which is coated on the copper layer, to provide a two-level pattern for subsequent etching of the copper layer and the ITO layer. The embossed photoresist is cured. Thereafter, the pattern in the copper layer is etched to form the copper lines, i.e. conductive paths for contacting the ITO pattern. Further, e.g. in a second etch step, the ITO layer is etched to form the ITO pattern of the touch sensor.

Such a system, as described above typically can result in a transmission Ty of about 89% and a sheet resistance of about 100 Ohm/square.

According to yet further embodiments, such a system can be further extended by a further dielectric, e.g. index matching, layer stack. Therefore, as a fourth layer, a low refractive index layer, e.g. SiOx, is deposited on the pattern. Thereafter, as a fifth layer, a high refractive index layer, e.g. Nb2O5, is deposited on the fourth layer. A one-level imprint step is provided in a photoresist, which is coated on the fifth layer, to provide a pattern for subsequent etching of the fifth layer and the fourth layer. The embossed photoresist is cured. Thereafter, the fifth layer is etched and the fourth layer is etched to uncover the copper lines, i.e. the conductive paths.

Since such an enhanced system having a fourth and a fifth dielectric layer can have a thicker ITO layer while invisibility is maintained, the enhances system, i.e. having buried ITO layer, can result in a transmission Ty of about 90% and a sheet resistance of about 50 Ohm/square.

Embodiments according to the present invention relate to a layer stack or transparent body comprising of a substrate, e.g. a transparent foil, and a stack of multiple layers that is mounted on top of a display e.g. with a clear adhesive. The transparent body can be sandwiched between two transparent foils. The first layer stack and the optional second layer stack include transparent, insulating materials with high and low refractive indexes (such SiOx, TiOx, NbOx, SiNx, SiOxNy, AlOxNy, MgF2, TaOx) and transparent conductive materials, like transparent conductive oxides, for example, ITO. According to implementations, the method of layer coating or layer deposition can be chemical or physical vapor deposition.

According to typical embodiments, which can be combined with other embodiments described herein, the first dielectric film being deposited on the substrate can typical be a high refractive index layer, e.g. with a refractive index of of at least 1.8 For example, a niobium-oxide containing film can be deposited as the first dielectric film on the substrate.

According to yet further embodiments, which can be combined with other embodiments described herein, a TCO thickness of below 145 nm, e.g. of 20 nm to 130 nm, such as 75 nm, will result in even better invisibility characteristics as the above described values.

According to yet further typical embodiments, the dielectric films 16, 18, 116, and 118 can be layers including oxides, nitrides or oxinitrides, wherein the respective oxide-compound, nitride-compound or oxinitride-compound includes at least 70 weight-%, typically at least 90 weight-% of the respective oxide-compound, nitride-compound, or oxinitride-compound. Thereby, either a layer structure for high transparency or a layer structure with improved transmission characteristics, as described below, can be provided.

More specifically, according to embodiments herein, the second, or optionally a fourth dielectric film or further dielectric films, can be a film, e.g. consisting of $SiO_2$ having a lower refractive index than the first dielectric film, e.g. consisting of $Nb_2O_5$, $Si_3N_4$ or the like. A first transparent layer stack of a transparent body, e.g. a two-layer-type stack, and a second transparent layers stack, e.g. a two-layer-type stack, manufactured according to embodiments herein provides, in view of the additional dielectric films in comparison to at least some known transparent bodies for use in a touch panel and the characteristic combination of films with different refractive indexes, a barrier that facilitates a proper transmission of light through the transparent body.

According to typical embodiments, which can be combined with other embodiments described herein, dielectric films with lower refractive indexes, for example lower than 1.50 or, more specifically, lower than 1.47 or, even more specifically, lower than 1.45, and dielectric films with higher refractive index, for example of at least 1.80 or, more specifically, at least 2.10, or, even more specifically, at least 2.40, are provided in an alternating manner. Thereby, films having lower refractive indexes can be provided by films containing SiOx, MgF, SiOxNy, or the like. For example, films having a higher refractive index can be provided by films containing NbOx, SiNx, SiOxNy, TiOx AlOx, AlOxNy, TaOx, or the like.

According to embodiments described herein, transparent body 10 includes a transparent conductive film 22, such as, but not limited to, indium tin oxide (ITO), in particular, crystalline ITO or ITO with a sheet resistance of 100 Ohm/square or below. According to different embodiments, which can be combined with other embodiments described herein, typically, ITO with composition of 90 weight-% $In_2O_3$ or more can be used. For example, ITO with composition 95 weight-% $In_2O_3$ and 5 weight-% $SnO_2$ for crystalline ITO and/or ITO with composition 93 weight-% $In_2O_3$ and 7 weight-% $SnO_2$ can be used.

According to yet further examples, the transparent substrate 14 can include plastic (flexible), which can further be already covered with thin film layers, a hard-coat, a linear or circular polarizer material, or lambda quarter retarder. For glass substrates, deposition processes and manufacturing methods on the glass substrate can be provided at higher temperatures as compared to the plastic substrates described herein. Accordingly, structures, which may be known from glass substrates, cannot be necessarily applied to plastic films or foils.

According to yet further embodiments, which can be combined with other embodiments described herein, the layer stack 12 is typically an index matching layer stack having at least a first and a second dielectric film, wherein the first refractive index is provided by the first dielectric film, and the second refractive index is provided by the second dielectric film, and wherein the second refractive index is lower than the first refractive index. According to an exemplary implementation, which can be combined with other embodiments described herein, a first dielectric film, a second dielectric film and a plurality of further dielectric films can be deposited such that a continuous or quasi-continuous (e.g. step-like with small steps) change in refractive index can be generated in the transparent layer stack 12. According to typical implementations, the dielectric films can be manufactured by chemical vapor deposition or physical vapor deposition, for example sputtering or evaporation. Typical examples can be insulating materials with high and low refractive indexes, for example SiOx, MgF, TiOx, NbOx, SiNx, SiOxNy, AlOx, AlOxNy, TaOx, and combinations thereof.

As described herein, a transparent conductive oxide layer 22 is deposited over the layer stack 12. According to embodiments described herein, the transparent conductive layer stack has increased conductivity by providing an increased layer thickness or a decreased specific resistance of the layer material. Thereby, for example, TCO layer thicknesses of 40 nm and above, e.g. 50 nm to 150 nm, can be utilized.

According to yet further embodiments, which can be combined with other embodiments described herein, the transparent conductive oxide layer can also be provided as a transparent conductive oxide layer stack having one or more transparent conductive oxide films. During manufacturing, the transparent conductive oxide film or transparent conductive film stack can be heated during or after deposition, for example by thermal heating or by RTP flashlights. Typically, the transparent conductive oxide can be heated to temperatures of 80° C. or above. The manufacturing of the transparent conductive oxide films can be provided by chemical vapor deposition or physical vapor deposition, e.g. sputtering or evaporation. In order to provide a high yield of manufacturing, for example DC sputtering of a transparent conductive oxide layer from a rotatable target can be provided. Typical examples of the transparent conductive oxide or the transparent conductive oxide layer stack can be ITO, doped ITO, impurity-doped ZnO, $In_2O_3$, $SnO_2$ and CdO, ITO ($In_2O_3$:Sn), AZO (ZnO:Al), IZO (ZnO:In), GZO (ZnO:Ga), IGZO, multi-component oxides including or consisting of combinations of ZnO, $In_2O_3$ and $SnO_2$, a layer stack from at least an ITO layer and a metal layer, e.g. an ITO/metal/ITO-stack or a metal/ITO/metal-stack.

According to typical implementations, the dielectric films can be manufactured by chemical vapor deposition or physical vapor deposition, for example sputtering or evaporation. Typical examples can be insulating materials with high and low refractive indexes, for example SiOx, TiOx, NbOx, SiNx, SiOxNy, AlOx, TaOx, and combinations thereof.

According to some embodiments described herein, the layer stack, for example a touch panel layer stack or transparent body, can be bonded to or integrated in a display device with improved visual and electrical characteristics. As described herein, it is referred to layer stack or transparent body. It will be appreciated that these terms are used synonymously here, e.g. a transparent body is also provided by a stack of layers or films, i.e. a transparent body is also a layer stack. The manufacturing of connection lines and TCO patterns in one SAIL process, e.g. a multi-level SAIL process, is very efficient. Further, manufacturing the connection lines with the SAIL process allows for lines having a small width and small distances between the lines. Thereby, the bezel of the touch panel layer stack can be small, and, thus, the bezel of the touch panel display can be small.

Figure 7:
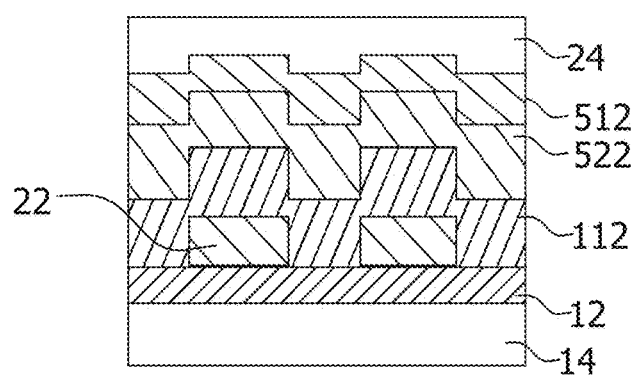
FIG. 7 is a schematic representation of a further exemplary transparent body for use in a touch panel in accordance with embodiments herein.

According to yet further embodiments, which can be combined with other embodiments described herein, the combination of the transparent layer stack 12 and the transparent conductive film can be repeated twice, three times or even four times. FIG. 7 shows a transparent layer stack 12 deposited over the substrate 14. The structured transparent conductive film 22 is provided on the transparent layer stack 12. Thereafter, a second transparent layer stack 112 and a further transparent conductive film 522 are deposited. Therein, different refractive indices are provided for adjacent films. The second transparent conductive film 522 is provided over the second transparent layer stack 112.

For easier illustration copper lines or connection lines of conductive material in general are omitted in FIG. 7. The cross-section illustrated in FIG. 5 does not show a structuring of the second transparent conductive film 522. However, the structuring can be applied such that it would be seen in a different cross-section. A further transparent layer stack 512 including, for example two yet further dielectric films, is deposited over the second TCO layer 522. The transparent adhesive 24 is provided on the further transparent layer stack 51 and is configured for bonding the transparent body to the electro-optical device, such a display or the like. Alternatively or additionally, a second substrate 14 can be provided at the top of the structure. The two or more layers of layer stacks allow for touch detection in several directions. Typically, the display has an x-coordinate and a y-coordinate. One patterned or structured transparent conductive film can detect the x-coordinate of the touch. Another patterned or structured transparent conductive film can detect the y-coordinate of the touch. For example, FIG. 3 illustrates one ITO pattern or grid. A full touch panel would include at least two ITO patterns or grids as shown in FIG. 3, such that a horizontal grid (x-coordinate) and a vertical grid (y-coordinate) can provide a full touch sensing.

FIG. 7 shows an embodiment wherein a vertical ITO grid and a horizontal ITO grid are manufactured in one layer stack. Alternatively, a vertical ITO grid and a horizontal ITO grid can be manufactured in two layer stacks, which can both be provided at the display.

According to certain embodiments, the first transparent layer stack, the transparent conductive film and the second transparent layer stack 112 are deposited in a manner such that the a* and b* values for the manufactured transparent body are below 1.5 or, in particular 1, or more specifically, 0.7, or, even more specifically, 0.2. In particular, according to embodiments herein, the a* and b* values for the structure formed solely by the first transparent layer stack, the transparent conductive film, and the transparent adhesive, and placed above a substantially transparent substrate, may adopt these values.

Figure 8A:
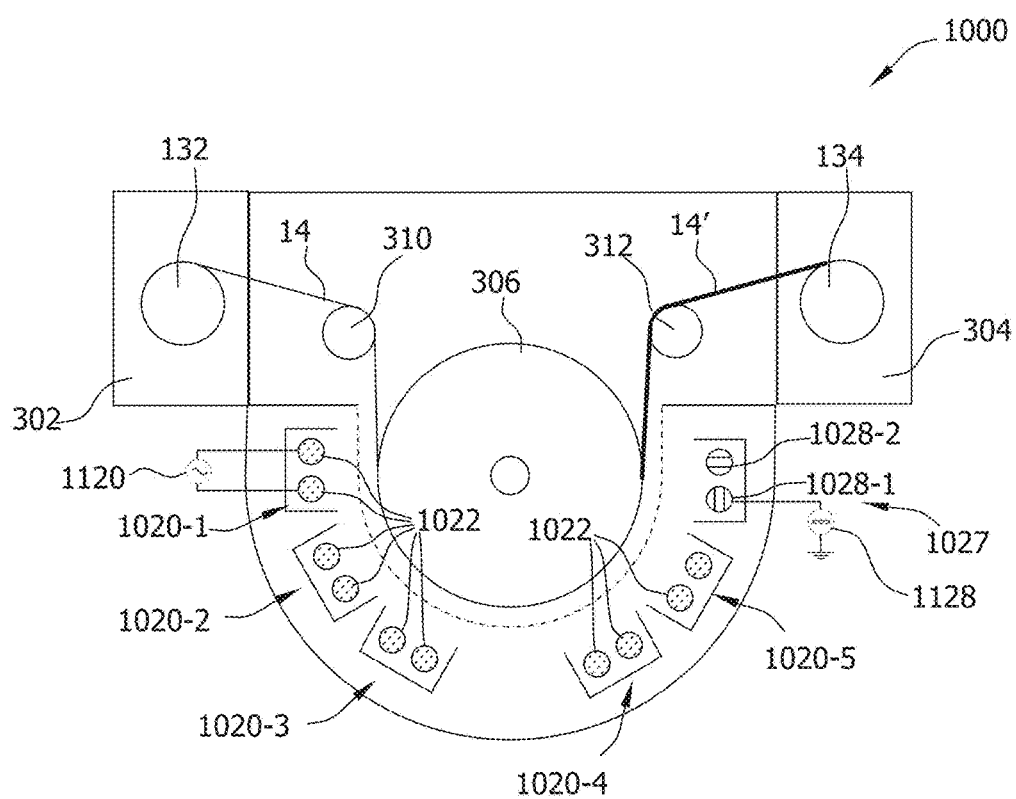
FIG. 8A is a schematic representation of an exemplary deposition apparatus for manufacturing of a transparent body for use in a touch panel in accordance with embodiments herein.

FIG. 8A shows an exemplary deposition apparatus 1000 for manufacturing of a transparent body for use in a touch panel in accordance with embodiments herein. Exemplary deposition apparatus 1000 is provided as a roll-to-roll system including an unwinding module 302, a winding module 304, and a process module disposed there between. Process module includes the deposition sources radially disposed about a processing drum 306.

Process module may further include auxiliary rollers 310, 312 for appropriately feeding a substrate 14 to processing drum 306, and facilitating feeding of a processed substrate 14' from process module 308 to winding module 304. In particular, a deposition apparatus according to embodiments herein may be constituted as a sputter roll coater for roll-to-roll deposition on a plastic film. The deposition apparatus 1000 may be a SmartWeb™, manufactured by Applied Materials, adapted for manufacturing a transparent body according to embodiments of the present disclosure.

The exemplarily deposition apparatus 1000 includes as the deposition sources a first deposition assembly having five target assemblies 1020-1 to 1020-5 and configured to deposit a first transparent layer stack 12 over a substrate 14, the first transparent layer stack 12 including a first dielectric film 16, a second dielectric film 18 and a third dielectric film 218. According to typical embodiments, each film of layer stack 12 is deposited in an individual deposition chamber or individual compartments of a deposition chamber. The exemplary deposition apparatus 1000 also includes a second deposition assembly configured to deposit a transparent conductive film 22.

According to embodiments herein, first deposition assembly and second deposition assembly are arranged such that first transparent layer stack 12 and transparent conductive film 22 are disposed over substrate 14 in this order. In the exemplary embodiment, first deposition assembly is arranged upstream relative to second deposition assembly, so that transparent conductive film 22 is deposited over first transparent stack 12. According to typical embodiments, deposition apparatus 1000 is configured to deposit the first and the third dielectric films having a low refractive index and the second dielectric film having a high refractive index.

According to some embodiments, which can be combined with other embodiments described herein, the apparatus 1000 can include 6 compartments, chambers or sub-chambers, such that each compartment can be operated under individual processing parameters, particularly with individual processing gases. As shown in FIG. 8A, the apparatus can include five rotatable MF cathodes or target assemblies 1020-1 to 1020-5 equipped with target tubes 1022. The other one compartment is equipped with a target assembly with at least one ITO rotatable target 1028-1 and 1028-2 powered in DC mode. Alternatively, an apparatus with six compartments or chambers can include four rotatable MF cathodes or target assemblies equipped with target tubes, e.g. Si target tubes or Nb target tubes. The other two compartments or chambers are equipped with target assemblies having ITO rotatable targets powered in DC mode. As shown in FIG. 8A exemplarily for one target assembly 1020-1 only, and for one target 1028-1 only, the respective MF- and DC-power supplies 1120 and 1128 are provided. The other target assemblies and targets are correspondingly equipped (not shown).

As further shown in FIG. 8A, the coating drum 306 has a rotation axis provided in the apparatus. The coating drum has a curved outer surface for guiding the substrate along the curved outer surface. The substrate is thereby guided through the several vacuum processing regions. Even though it is often referred to herein to deposition stations as the processing stations, also other processing stations, like etch stations, pre-treatment stations, heating stations, etc. can be provided along the curved surface of the coating drum 306.

Generally, according to different embodiments, which can be combined with other embodiments described herein, a sputter deposition source, an evaporation deposition source or a plasma deposition source can be adapted for depositing a thin film on a flexible substrate, e.g., a web or a foil. FIG. 8A shows sputter deposition sources for depositing the layer stack and the transparent conductive oxide film utilized in embodiments described herein. However, particularly the dielectric layers can also be deposited with a CVD source, specifically a PECVD source.

Thereby, the dielectric films of the dielectric layer stack can be deposited by PECVD sources. The TCO layer, e.g. ITO, and the conductive material, e.g. copper, can be deposited by PVD, particularly by sputtering. FIG. 8 shows rotatable sputter targets 1028-1 and 1028-2 in deposition sources 1027 for deposition of e.g. ITO and copper thereafter.

Generally, PVD deposition sources can, for example, be rotatable cathodes having targets of the material to be deposited on the substrate or evaporators. Typically, the sputter cathodes can be rotatable cathodes with a magnetron therein. Thereby, magnetron sputtering can be conducted for depositing of the layers. Cathodes are connected to an AC power supply such that the cathodes can be biased in an alternating manner.

As used herein, "magnetron sputtering" refers to sputtering performed using a magnet assembly, that is, a unit capable of a generating a magnetic field. Typically, such a magnet assembly consists of a permanent magnet. This permanent magnet is typically arranged within a rotatable target or coupled to a planar target in a manner such that the free electrons are trapped within the generated magnetic field generated below the rotatable target surface. Such a magnet assembly may also be arranged coupled to a planar cathode.

Thereby, magnetron sputtering can be realized by a double magnetron cathode, i.e. two cathodes as shown in FIG. 8, such as, but not limited to, a TwinMag™ cathode assembly. Particularly, for MF sputtering from a silicon target, target assemblies including double cathodes can be applied. According to typical embodiments, the cathodes in a deposition chamber may be interchangeable. Accordingly, the targets are changed after the silicon has been consumed.

According to typical embodiments, dielectric layers can be deposited by PECVD or by sputtering, for example magnetron sputtering. Magnetron sputtering can particularly be conducted of rotatable cathodes having an AC power supply. Typically, MF sputtering can be applied for depositing the dielectric layers. Thereby, according to typical embodiments, sputtering from a silicon target, e.g. a sprayed silicon target, is conducted by MF sputtering, that is middle frequency sputtering. According to embodiments herein, middle frequency is a frequency in the range 5 kHz to 100 kHz, for example, 10 kHz to 50 kHz. Sputtering from a target for a transparent conductive oxide film is typically conducted as DC sputtering. The two cathodes can be connected to a DC power supply together with anodes collecting electrons during sputtering. Thus, according to yet further embodiments, which can be combined with other embodiments described herein, the transparent conductive oxide layers, for example the ITO layers, can be sputtered by DC sputtering.

Figure 8B:
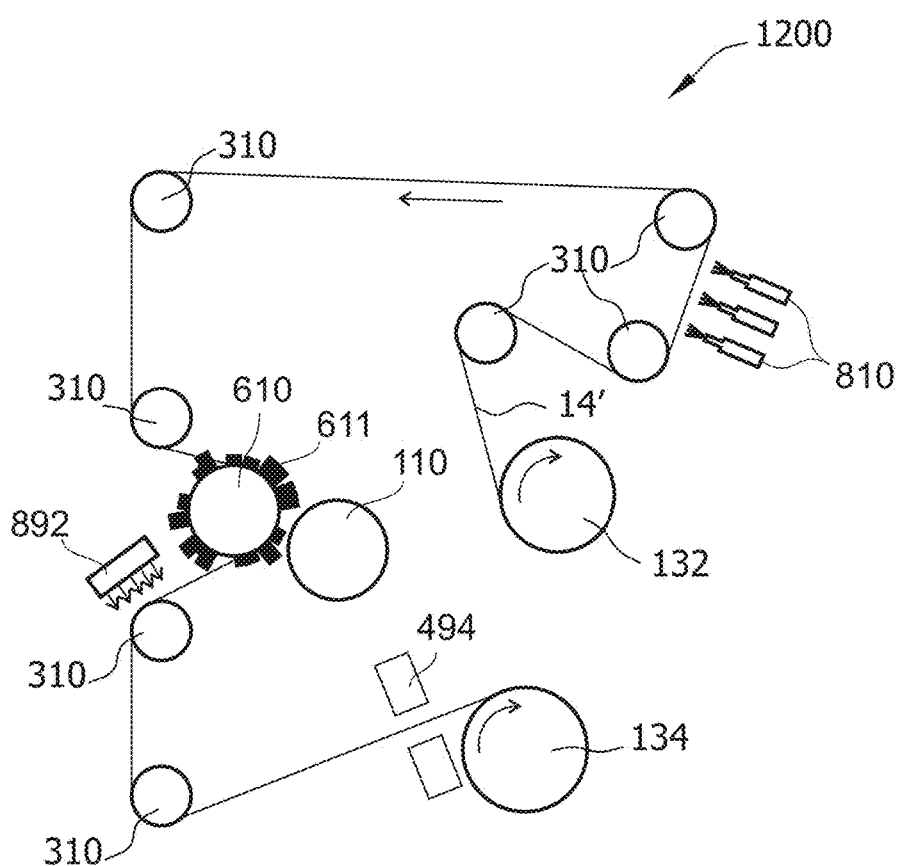
FIG. 8B is a schematic representation of an apparatus for manufacturing a patterned polymer layer for use in a transparent body for use in a touch panel in accordance with embodiments herein.

After deposition of the layers of the transparent body, according to embodiments described herein, the roll with the processed substrate can be transferred to another station of a manufacturing system, e.g. an imprint station 1200 as illustrated in FIG. 8B. A polymer layer acting as a photoresist is coated on the substrate 14' having the layers thereon. For example, the polymer layer can be sprayed by one or more sources 810. The substrate is guided through the imprint station 1200 via various rollers 310. After the polymer layer has been deposited on the substrate, a stamp 611 is used to emboss the pattern in the polymer layer. The imprinted photoresist is cured thereafter by UV source 892. According to yet further embodiments, which can be combined with other embodiments described herein, optionally also an optical measurement unit 494 for evaluating the result of the substrate processing can be provided.

Figure 9:
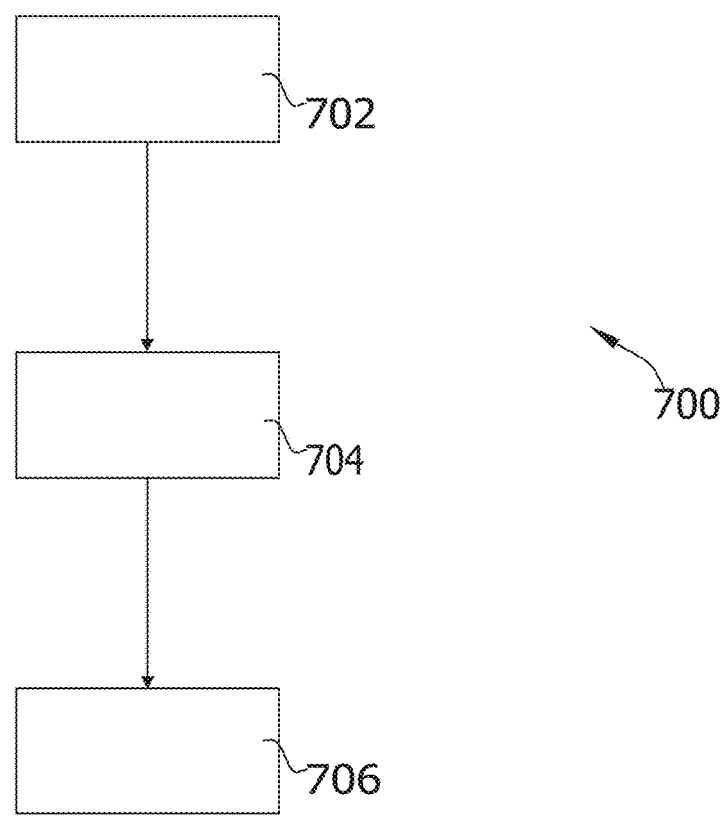
FIG. 9 is a flow chart illustrating methods of manufacturing a transparent body for use in a touch panel in accordance with embodiments herein.

FIG. 9 shows a flowchart 700 illustrating a process for manufacturing a transparent body as described herein. In step 702, the first transparent layer stack (e.g. layers stack 12) is deposited over the transparent substrate. Thereby, the layer stack includes at least two dielectric films, wherein the refractive indices of the dielectric films are different from each other and films with a higher refractive index and films with the lower refractive index can be deposited in an alternating manner. In step 704, the transparent conductive film, for example structured ITO layer, and a layer of conductive material are deposited over the transparent layer stack 12. According to different implementations, which can be combined with other implementations described herein, the transparent conductive film can be also a stack of conductive films. For example, a TCO/metal/TCO-stack can be provided in step 704. In step 706, the TCO layer 4 and the conductive layer are processed with a SAIL process.

Invisible ITO solutions have extremely high demands on the optical uniformity of optical properties (color values in transmission and reflection). This corresponds technically to the deposition of uniform films with respect to film thickness and optical dispersion properties. Accordingly, the deposition apparatuses as described herein can further include a measurement system (see, 494 in FIG. 8B, configured for measuring during deposition optical properties of at least one of the films forming part of at least one of the first layer stack or the transparent conductive film.

As described herein, the transparent conductive film has a sheet resistance of 100 Ohm/square or below, particularly of 50 Ohm/square or below for buried TCO. This can be provided by providing a comparably thick transparent conductive layer and/or utilizing a TCO material with a low specific resistivity. This results in a more complex index-matching situation for reaching the required high optical performance such as pattern invisibility, color neutrality and high transmittance levels.

As described above, according to some embodiments, which can be combined with other embodiments described herein, the transparent body, i.e. the thin film stacks, are produced involving magnetron sputtering from rotary targets.

According to one embodiment a process for manufacturing a transparent body for a touch screen panel is described. The process includes depositing a first transparent layer stack over a flexible transparent substrate, wherein said first transparent layer stack includes at least a first dielectric film with a first refractive index, and a second dielectric film with a second refractive index different from the first refractive index; providing a transparent conductive film over the first transparent layer stack; depositing a layer of a conductive material over the transparent conductive film; providing a polymer layer over the layer of a conductive material; imprinting a pattern, particularly a 3D pattern, on the polymer layer; etching the layer of the conductive material based upon the pattern to form conductive paths for the touch screen panel; and etching the transparent conductive film based upon the pattern to form a structured transparent conductive pattern for touch detection.

According to optional modifications thereof, which can be provided additionally or alternatively to each other for the processes described herein and/or the transparent bodies described herein, the first dielectric film has a refractive index of at least 1.8 and the second dielectric film has a refractive index of 1.5 or below; and/or wherein the third dielectric film has a refractive index of at least 1.8 and the fourth dielectric film has a refractive index of 1.5 or below; the transparent conductive film has a thickness of 20 nm and above, particularly of 50 nm to 150 nm; the transparent conductive film includes indium tin oxide (ITO); the transparent conductive film is provide onto a dielectric film with a refractive index of 1.5 or below and a dielectric film with a refractive index of 1.8 or above is provided onto the transparent conductive film; a transparent adhesive is provided for bonding the layer stack to the touch screen panel; and/or a process further includes depositing a SiOx seed layer on the flexible substrate before depositing the first transparent layer stack.

According to typical embodiments, which can be combined with other embodiments described herein, the flexible transparent substrate is selected from the group consisting of: an organic substrate, an inorganic substrate, plastic foil according to the example described herein, a polarizer material substrate, and a lambda quarter retarder substrate.

The written description uses examples to disclose the invention, including the best mode, and to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the examples of embodiments and embodiments or modifications thereof described above may be combined with each other.

While the foregoing is directed to embodiments of the invention, other and further embodiments of the invention may be devised without departing from the basic scope thereof, and the scope thereof is determined by the claims that follow.

The invention claimed is:

1. A process for manufacturing a transparent body for a touch screen panel, the process comprising:
   using a roll-to-roll system including an unwinding module, a winding module, and a processing module to:
      deposit a first transparent layer stack over a flexible transparent substrate, wherein said first transparent layer stack includes at least a first dielectric film with a first refractive index of at least 1.8, and a second dielectric film with a second refractive index of 1.5 or below;
      sputter deposit a transparent conductive film over the first transparent layer stack; and
      sputter deposit a layer of a conductive material over the transparent conductive film; and
   transferring the flexible transparent substrate from the roll-to-roll system to a roll-to-roll imprint station to:
      provide a polymer layer over the layer of a conductive material;
      imprint a multi-level pattern into the polymer layer with a stamp;
      etch the layer of the conductive material exposed by the multi-level pattern to form conductive paths for the touch screen panel; and
      etch the transparent conductive film based upon the multi-level pattern to form a structured transparent conductive pattern for touch detection.

2. The process according to claim 1, wherein the multi-level pattern is a 3D pattern or a first topography having more than one level of depths of an imprint.

3. The process according to claim 1, further comprising:
   depositing a second transparent layer stack over the structured transparent conductive pattern, wherein said second transparent layer stack is selected from the group consisting of:
      a layer stack, wherein the layer stack includes a third dielectric film with a gradient refractive index from a third refractive index to a fourth refractive index different from the third refractive index, and
      a layer stack, wherein the layer stack includes at least a third dielectric film with a third refractive index and a fourth dielectric film or a transparent adhesive, respectively with a fourth refractive index different from the third refractive index, providing a further photoresist over the second transparent layer stack;
   imprinting a further pattern, on the further photoresist; and
   etching the second transparent layer stack based upon the further pattern to uncover the conductive paths.

4. The process according to claim 3, wherein the further pattern is a further 3D pattern or a second topography having one or more levels of depths of an imprint.

5. The process according to claim 1, wherein at least one of the first dielectric film, the second dielectric film or the transparent conductive film is deposited by sputtering of a target.

6. The process according to claim 1, wherein the first dielectric film has a refractive index of at least 1.8 and the second dielectric film has a refractive index of 1.5 or below.

7. The process according to claim 3, wherein the first transparent layer stack and the second transparent layer stack are index matching layer stacks and/or are selected from the group consisting of: $SiO_x$, $SiN_x$, $SiO_xN_y$, $AlO_x$, $AlO_xN_y$, $TiO_x$, TaOx, MgFx, and NbO.

8. The process according to claim 1, wherein the dielectric films are sputtered by medium frequency (MF) sputtering, and the transparent conductive films are sputtered by direct current (DC) sputtering.

9. The process according to claim 1, wherein the transparent conductive film includes indium tin oxide (ITO).

10. The process according to claim 1, wherein the layer of conductive material includes at least 50 weight-% Cu, Ag, Al, AlNd, Mo, or MoNb.

11. The process according to claim 1, wherein the flexible transparent substrate is a plastic film.

12. The process according to claim 1, wherein the flexible transparent substrate is a polyethylene terephthalate (PET) film, a cyclic-olefin-copolymer (COC) film, a triacetate (TAC) film, a cycloolefin polymer (COP) film, or a polyethylene naphthalate (PEN) film.

13. The process according to claim 11, wherein the plastic film is hard coated.

14. The process according to claim 1, further comprising:
   providing a second flexible film to cover the transparent body.

15. The process according to claim 5, wherein at least one of the first dielectric film, the second dielectric film or the transparent conductive film is deposited by sputtering of a rotary target.

16. The process according to claim 3, wherein the third dielectric film has a refractive index of at least 1.8 and the fourth dielectric film has a refractive index of 1.5 or below.

17. The process according to claim 8, wherein the dielectric films are sputtered by medium frequency (MF) sputtering from a rotatable target, and the transparent conductive films are sputtered by direct current (DC) sputtering from a rotatable target.

* * * * *